(12) United States Patent
Kuzmenka

(10) Patent No.: US 7,236,378 B2
(45) Date of Patent: Jun. 26, 2007

(54) SIGNAL DISTRIBUTION TO A PLURALITY OF CIRCUIT UNITS

(75) Inventor: Maksim Kuzmenka, München (DE)

(73) Assignee: Infineon Technologies AG, Munich (DE)

( * ) Notice: Subject to any disclaimer, the term of this patent is extended or adjusted under 35 U.S.C. 154(b) by 361 days.

(21) Appl. No.: 10/295,710

(22) Filed: Nov. 15, 2002

(65) Prior Publication Data

US 2003/0099093 A1 May 29, 2003

(30) Foreign Application Priority Data

Nov. 26, 2001 (DE) ................................ 101 57 836

(51) Int. Cl.
*H02M 3/335* (2006.01)
(52) U.S. Cl. ................................ 363/21.12; 363/21.15; 363/170
(58) Field of Classification Search ................ 336/223, 336/180, 211, 69, 212; 365/226; 307/11, 307/17, 151, 29; 363/31, 49, 21.15, 21.12, 363/170–171, 173; 323/355
See application file for complete search history.

(56) References Cited

U.S. PATENT DOCUMENTS

| 4,213,084 | A | * | 7/1980 | Hiromitsu | 323/250 |
| 4,302,728 | A | * | 11/1981 | Nakamura | 331/25 |
| 4,962,485 | A | * | 10/1990 | Kato et al. | 365/229 |
| 5,065,301 | A | * | 11/1991 | Shioya et al. | 363/17 |
| 5,184,350 | A | * | 2/1993 | Dara | 370/466 |
| 5,394,367 | A | * | 2/1995 | Downs et al. | 365/195 |
| 5,430,895 | A | * | 7/1995 | Huusko | 455/327 |
| 5,528,481 | A | * | 6/1996 | Caldeira et al. | 363/20 |
| 5,550,452 | A | * | 8/1996 | Shirai et al. | 320/108 |
| 5,594,680 | A | * | 1/1997 | Ohtake et al. | 365/63 |
| 5,850,416 | A | | 12/1998 | Myer | 365/63 |
| 6,049,258 | A | * | 4/2000 | Fawal et al. | 333/177 |

* cited by examiner

*Primary Examiner*—Anh Mai
(74) *Attorney, Agent, or Firm*—Laurence A. Greenberg; Werner H. Stemer; Ralph E. Locher

(57) ABSTRACT

A device for distributing a signal, in particular a clock signal or a command/address signal from a signal source to a plurality of circuit units, includes a transformer. The transformer has a primary winding receiving the signal from the signal source. Further, the transformer includes a plurality of secondary windings, which are arranged to interact with the primary winding to transfer the signal to the circuit units.

14 Claims, 2 Drawing Sheets

SIGNAL DISTRIBUTION TO A PLURALITY OF CIRCUIT UNITS

BACKGROUND OF THE INVENTION

1. Field of the Invention

The present invention relates to a device for distributing a signal from a signal source to a plurality of circuit units. In particular, the present invention relates to such a device, which is suited to distributing control signals, e.g. clock signals or command/address signals, in a memory system, to a plurality of memory chips arranged on the memory module.

2. Description of Prior Art

Generally, a memory module, for example a DRAM module, includes a plurality of memory chips, which are arranged on the board of the memory module, the latter normally referring to a multi-layer board. Further, a clock signal source is normally provided in the form of a PLL-chip (PLL=phase-locked loop). The phase-locked loop generates a clock signal, which is supplied to the memory chips.

Up until now, for ensuring synchronicity, the signal lines, on which the clock signal from the PLL was supplied to each memory chip, had to comprise the same electrical length. For realizing this objective, it has so far been necessary to provide a multitude of meandering structures on the memory module in order to implement the clock feed lines of varying lengths. To realize these meandering structures it is normally necessary to provide at least one additional layer on the board (PCB=printed circuit board), which, as a rule, involves a multi-layer board.

SUMMARY OF THE INVENTION

The object of the present invention is to provide a device for a synchronized distribution of a signal from a signal source to a plurality of circuit units, which, as compared to the state of the art, has a simplified structure.

This object is achieved by a device for distributing a signal from a signal source to a plurality of circuit units, which includes a transformer. The transformer has a primary winding receiving the signal from the clock source. The transformer further has a plurality of secondary windings arranged to interact with the primary winding to transfer the signal to the circuit units.

The present invention is based on the idea that the magnetic field in the primary winding of the transformer is simultaneous for all secondary windings. Thus, a plurality of secondary windings is arranged such that, via a magnetic coupling, a voltage applied across the primary winding is converted in voltages applied across the secondary windings, which makes up the nature of a transformer. Thus, the signal may be supplied simultaneously to a plurality of circuit units, which are correspondingly connected to the secondary windings.

The present invention is especially suitable for use in memory modules and, there, in particular, for distributing the control signals, i.e. the clock signals or the command/address signals, to the individual memory chips. In such memory systems, the clock signal, which is for example provided by a phase-locked loop or a clock buffer, has to be distributed to a plurality of memory chips, which may be arranged on the same board as the clock source. Examples of such memory modules include DRAM modules (DRAM=dynamic random access memory).

In accordance with the invention, the transformer of the signal distribution device may preferably be formed as a printed transformer in or on the board, which also carries the signal source and the circuit units. The term "board" respectively includes herein also such arrangements consisting of a plurality of layers, such that there is no need to mention the same individually. Alternatively, the primary winding may be arranged on the board, while the secondary windings may be formed directly on the packages of the circuit units, which, for example, may involve IC chips. Particularly BGA packages (BGA=ball grid array) or other flat packages are suitable in this case.

The inventive signal distribution device using a transformer includes a number of advantages. A trace matching for the signal is no longer necessary, since the magnetic field in the primary winding occurs at the same time for all of the secondary windings. Each of the secondary windings is connected to one of the circuit units via respective connection lines, wherein the secondary winding and the connection line for each circuit unit preferably comprise an identical topology such that, starting from the secondary winding, an identical electrical length is ensured. Therefore, the topology for the signal supply may be absolutely identical for each memory chip. Additional layers in the board, as mentioned above for realizing the length adaptations of the lines for clock signals, are no longer necessary. Further, the signal source only has to comprise a single output, wherein, for example, it is possible for a phase-locked loop serving as a clock signal source to use a package having eight to ten terminal pins, thus reducing the space requirement for the phase-locked loop.

BRIEF DESCRIPTION OF THE DRAWINGS

Preferred embodiments of the present invention will be described below with reference to the attached drawings, in which.

DESCRIPTION OF PREFERRED EMBODIMENTS OF THE INVENTION

The present invention will be explained in detail below with reference to the memory module, and, in particular, to a DRAM memory module. Further, the invention will be explained in detail with reference to the distribution of the clock signal in such a memory module. It should be clear, however, that the present invention is not limited to this application case, but may always be employed when a plurality of separated circuit units require the same signal from a signal source and, in particular, when the signal needs to be synchronously supplied to the circuit units.

Figure 1:
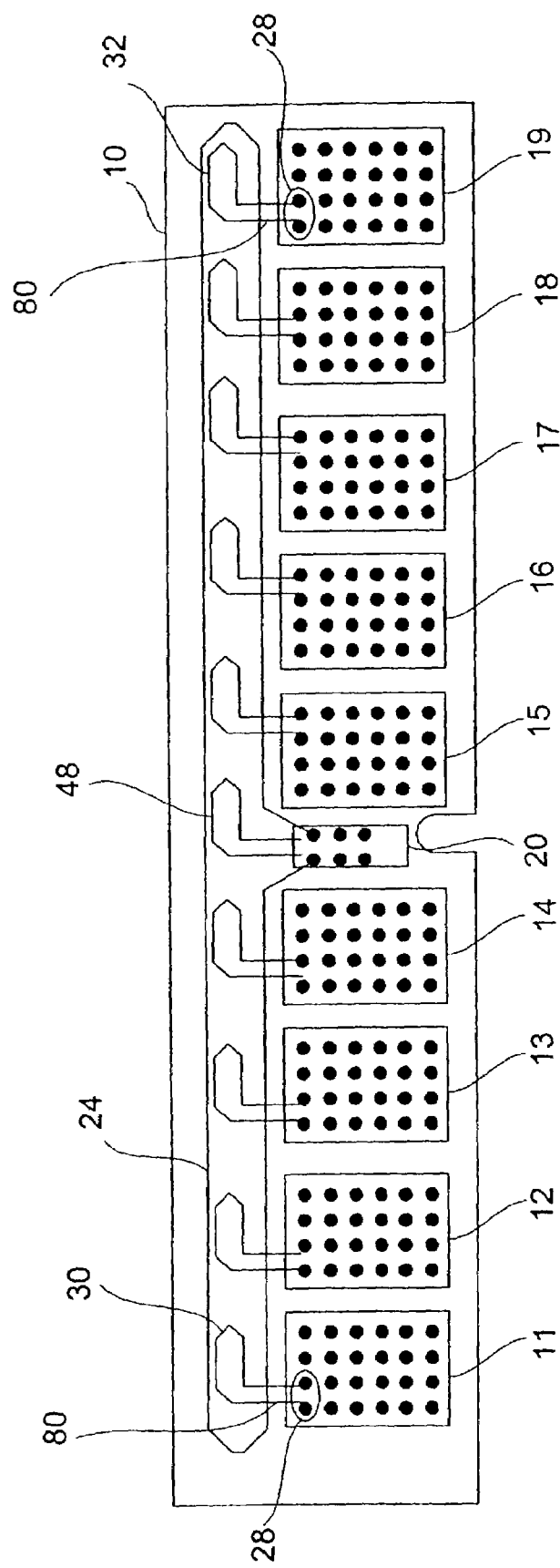
FIG. 1 shows a schematic representation of an embodiment of an inventive signal distribution device.

In FIG. 1 a schematic memory module 10 is shown, on which nine memory chips 11 to 19 are arranged. On the memory module 10 a PLL-chip 20 and/or a PLL-circuit 20 is further arranged, which provides a clock signal for the memory chips 11 to 19. As a rule, the memory module 10 includes a multi-layer board, on which the memory chips 11 to 19 and the PLL-chip 20 are arranged.

The PLL-chip 20 provides a clock signal for the memory chips 11 to 19 at a differential output 22 (FIG. 2) of the same. A primary winding 24 of the transformer 26 used in the inventive clock-signal distribution device is connected to the differential output 22 comprising the outputs OUT+ and OUT−.

Figure 2:
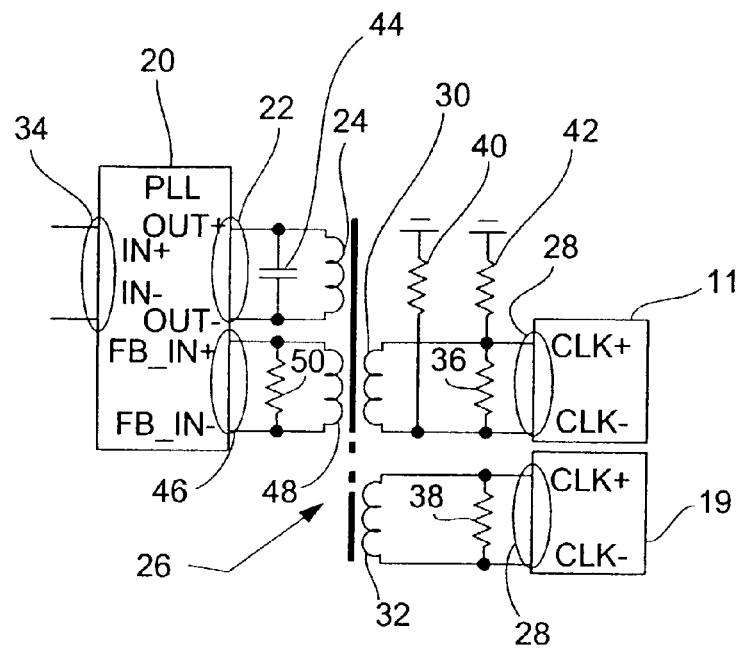
FIG. 2 shows a schematic equivalent circuit diagram of an embodiment of an inventive signal distribution device.

Secondary windings, two of which are eg designated with the reference numbers 30 and/or 32, of the inventive transformer 28 are each connected to a clock-signal input 28 of each of the memory chips 11 to 19, of which only the chips 11 and 19 are shown in FIG. 2. The clock signal inputs 28 each comprise terminals CLK+ and CLK− to receive the voltages dropping across the secondary windings 30 and 32.

As can be seen from the schematic equivalent circuit diagram in FIG. 2, the PLL circuit 20 further includes a differential input 34 having terminals IN+ and IN−, at which the PLLcircuit 20 receives an input voltage, on the basis of which the clock signal is generated. In FIG. 2 resistors 36 and 38 are further represented, at which the voltages applied across the inputs 28 will drop. For the memory chip 11 optional adjusting rheostats 40 and 42 are further shown, which are dimensioned to adjust the voltage drop across the resistor 36 and, thus, the voltage drop across the input 28. Here it should be noted, that the respective windings, i.e. the line length, the winding number, and the like, as well as resistors 36, 38, 40 and 42 may be dimensioned to generate a suitable voltage drop across the inputs 28.

As is further shown in FIG. 2, a capacitor 44 may be optionally connected in parallel to the primary winding 24. This capacitor 44 at the output of the PLL circuit 20, together with the loop inductivity of the primary winding 24, generates resonance circuit reducing the jitter and encases a voltage swing in the quality factor.

Further, a feedback input 46 is shown in FIG. 2, to which a feedback secondary winding 48 is connected. In FIG. 2, in turn, a corresponding voltage drop resistor 50 is shown in parallel to the feedback secondary winding 48. The feedback input is a differential input and includes the terminals FB_IN+ and FB_IN−. This feedback input 34 provides the necessary phase-locked loop feedback to provide a phase control of the clock signal, which is supplied to the memory chips 11 to 19, with respect to the input signal, which is input at the input 34. For this purpose, the secondary winding 48 having the corresponding terminals, via which the same is connected to the feedback input 34, preferably has an identical topology such as the secondary windings, which are connected via corresponding supply lines to the memory chips 11 to 19.

In the described circuit structure, the PLL-circuit 20 outputs a clock signal to the primary winding 24. As a result, a magnetic field is generated in the primary winding, which is simultaneous for all secondary windings. By way of this magnetic field a current is induced in the secondary windings, for example 30, 32 and 48 in FIG. 2, wherein, owing to the resistors 36, 38 and 50, which may be respective input resistors, a defined voltage drop occurs across the corresponding inputs. It is clear that, for generating a suitable voltage drop across the inputs 28 of the memory chips, the primary winding and the secondary winding may comprise different winding numbers. If now the topologies for the individual memory chips 11 to 19 are identical with respect to the clock supply starting from the secondary winding, the clock signal will be simultaneously supplied to the memory chips. That is, that the clock signal comprises the same shift for all of the memory chips.

Figure 3:
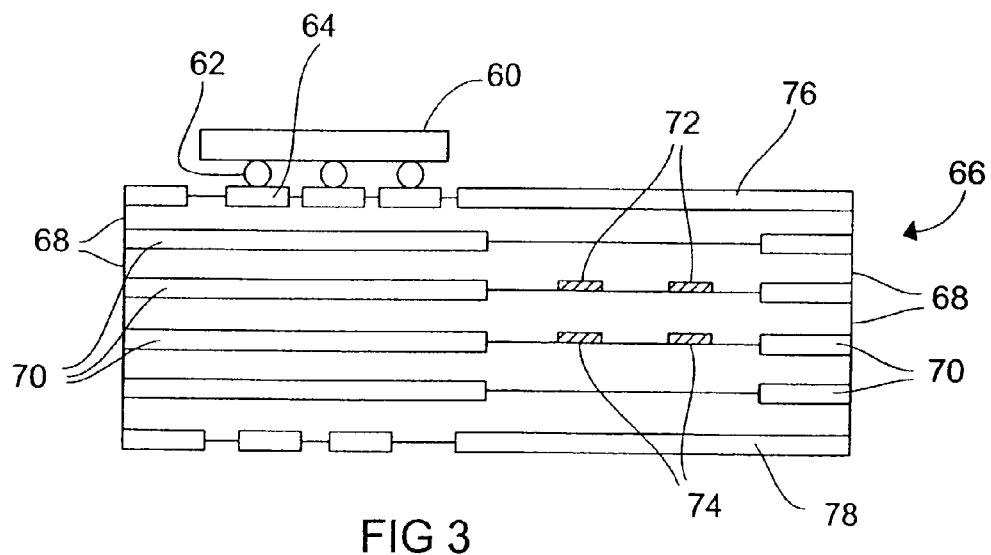
FIG. 3 shows a schematic cross-sectional view of a possible realization in a multi-layer board.

A schematic cross-sectional representation of an exemplary realization of an inventive clock-signal distribution device in a multi-layer board is shown in FIG. 3. In FIG. 3 a component, which may be a memory chip, is schematically shown, which is connected to pads 64 on a multi-layer board 66 via corresponding conducting means 62, such as solder bumps, terminal pins and the like. In FIG. 3 three pads 64 having corresponding contacting means 62 are depicted just for the purpose of illustration. In reality, a memory chip includes for example a greater number of terminals which, on the one hand, include the already mentioned clock input, and, on the other hand, data inputs and/or control inputs.

The multi-layer substrate shown in FIG. 3 includes a plurality of insulating dielectric layers 68, which each carry structured conductive layers 70, for example metal layers, in order to realize a desired connection line topology, elements, should be noted that such conductive layers 70 are purely schematically shown in FIG. 3.

The transformer of the inventive clock signal distribution device may now be integrated within such a multi-layer structure, wherein, in FIG. 2, conductive structures representing a primary winding 72 and conductive structures representing a secondary winding 74 are schematically shown. In order to achieve a good magnetic coupling between the primary winding 72 and the secondary winding 74, it is advantageous to arrange the same as close as possible beside each other on the same layer or above and/or below each other on adjacent layers, as is the case in FIG. 3. In order to further support the magnetic coupling it is further possible to use a magnetic core (not shown), for example in the form of a ferrite stripe along the printed transformer. Such a magnetic core increases the magnetic coupling on the one hand and reduces the influence of perturbing radiation (EMI=electromagnetic interference) on the other. Further, in the multi-layer structure 66 above and below the primary windings and secondary windings forming the transformer conductive full-surface layers 76 and 78 are preferably provided, which serve for shielding the electromagnetic interference. As shown in FIG. 3, these may be, for example, the uppermost and lowermost layer of the multi-layer substrate 66. These electromagnetic interference-shielding layers 76 and 78 may preferably consist of copper and have to be connected to ground.

In such a structure of a printed transformer, as is schematically shown in the cross-sectional view of FIG. 3, the distance between the printed windings and the ground level and/or supply level must be greater than the distance between the signals traces of the printed transformer.

As an option to the described structure, the primary windings may be arranged on the board, while the secondary windings may be arranged on the respective circuit units, i.e. on the packages of the same. In such a case, the circuit unit must be attached on the board by means of suitable prior art connecting techniques to ensure that the secondary coils and the primary coils are suitable arranged with respect to each other to effect a magnetic coupling. For this purpose, the primary coil and the secondary coil may be arranged opposite to each other, if the circuit units are arranged on the board, wherein flat packages, for example, BGA packages, are suitable for this purpose.

Returning to FIG. 1, the secondary windings, two of which are for example designated with the reference numbers 30 and 32, and the supply lines 80, via which the secondary windings are connected to the respective inputs 28 of the circuit chips, comprise an essentially identical topology. The term "an essentially identical topology" means such a topology which provides an essentially identical electrical length between the transformer and the input at the circuit chip.

As an option to the clock-signal distribution described with reference to the preferred embodiment other signals, which are to be supplied to a plurality of circuit units in a preferably synchronous manner, may as well be distributed in accordance with the invention. For example, mention should be made of the command/address signals, which are also supplied to all of the memory chips of a memory module in a preferably simultaneous manner. With such signals it should be appreciated, however, that these are not periodical, wherein long sequences of zeros or ones may be lost during the transmission via the transformer. Here, it should be noted that such sequences, for example more than four digits without any level change, may not occur. This may happen by providing a channel code ensuring that such sequences do not occur, for example.

What is claimed is:

1. A device for distributing a clock signal from a signal source to a plurality of circuit units, comprising: a transformer, said transformer including:
    a primary winding receiving the clock signal from the signal source; and
    a plurality of secondary windings arranged to interact with said primary winding to transmit the clock signal to the circuit units;
    said plurality of secondary windings including a first secondary winding having a first terminal and a second terminal, and a second secondary winding having a first terminal and a second terminal, clock signal inputs of a first one of the circuit units being connected to said first terminal and said second terminal of said first secondary winding and clock signal inputs of a second one of the circuit units being connected to said first terminal and said second terminal of said second secondary winding.

2. The device in accordance with claim 1, wherein a capacitor is connected in parallel to said primary winding.

3. The device in accordance with claim 1, wherein the signal source is a clock-signal source including a phase-locked loop, and a further secondary winding is provided, which interacts with said primary winding to generate a feedback signal to the phase-locked loop.

4. The device in accordance with claim 1, wherein said primary winding and said secondary winding are formed by conductive traces of a printed circuit.

5. The device in accordance with claim 4, wherein the printed circuit includes a magnetic core for improving the magnetic coupling between said primary winding and said secondary windings.

6. The device in accordance with claim 4, wherein the printed circuit includes several layers, and said primary windings and said secondary winding are arranged on the same layer or adjacent layers.

7. The device in accordance with claim 1, wherein each secondary winding is connected to one of the circuit units via connection lines, and the arrangement of secondary winding and connection line for each circuit units includes an essentially identical topology.

8. The device in accordance with claim 1, wherein the circuit units are memory chips.

9. The device in accordance with claim 1, wherein the signal source is a clock-signal source or a command/address signal source.

10. The device in accordance with claim 1, wherein said primary winding is arranged on a board and the said secondary windings are arranged on the circuit units.

11. The device in accordance with claim 1, wherein at least a portion of each of said secondary windings is arranged opposite to a portion of said primary winding.

12. A device for distributing an information signal from a signal source to a plurality of circuit units, comprising:
a transformer, said transformer including:
    a primary winding receiving the information signal from the signal source; and
    a plurality of secondary windings arranged to interact with said primary winding to transmit the information signal to the circuit units,
    said plurality of secondary windings including a first secondary winding having a first terminal and a second terminal, a second secondary winding having a first terminal and a second terminal, information signal inputs of a first one of the circuit units being connected to said first terminal and said second terminal of said first secondary winding and information signal inputs of a second one of the circuit units being connected to said first terminal and said second terminal of said second secondary winding.

13. The device in accordance with claim 12, wherein the information signal is a command signal or an address signal.

14. The device in accordance with claim 12, wherein the circuit units are memory chips.

* * * * *